US009484620B2

(12) United States Patent
Kuo

(10) Patent No.: US 9,484,620 B2
(45) Date of Patent: Nov. 1, 2016

(54) SYSTEMS AND METHODS FOR PROVIDING TIMING TRACKING LOOPS IN A COMMUNICATION SYSTEM

(75) Inventor: Chun-Hsuan Kuo, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 921 days.

(21) Appl. No.: 13/564,282

(22) Filed: Aug. 1, 2012

(65) Prior Publication Data

US 2013/0259093 A1    Oct. 3, 2013

Related U.S. Application Data

(60) Provisional application No. 61/618,049, filed on Mar. 30, 2012.

(51) Int. Cl.
| | |
|---|---|
| *H04B 1/00* | (2006.01) |
| *H04B 7/216* | (2006.01) |
| *H01Q 1/24* | (2006.01) |
| *G01C 21/26* | (2006.01) |
| *H03H 7/40* | (2006.01) |

(52) U.S. Cl.
CPC .............. *H01Q 1/243* (2013.01); *G01C 21/26* (2013.01); *H03H 7/40* (2013.01)

(58) Field of Classification Search
CPC ........... H01Q 21/28; H01Q 1/24; H01Q 5/00
USPC .......................................... 375/134; 370/320
See application file for complete search history.

(56) References Cited

U.S. PATENT DOCUMENTS

| | | | | |
|---|---|---|---|---|
| 5,390,207 | A | * | 2/1995 | Fenton .................. G01S 19/215 342/357.61 |
| 5,414,729 | A | * | 5/1995 | Fenton .................... G01S 19/22 342/357.61 |
| 5,987,016 | A | * | 11/1999 | He ........................ H04B 1/7115 370/320 |
| 6,047,017 | A | * | 4/2000 | Cahn ...................... G01C 21/26 375/134 |
| 2001/0014114 | A1 | * | 8/2001 | Baltersee ............. H04B 1/7085 375/148 |
| 2002/0006158 | A1 | * | 1/2002 | Schmidl ............... H04B 1/7075 375/150 |
| 2003/0118085 | A1 | * | 6/2003 | Taipale ................ H04B 1/7085 375/150 |
| 2004/0042531 | A1 | * | 3/2004 | Arikan ................. H04B 1/7115 375/148 |
| 2004/0132443 | A1 | * | 7/2004 | Klein et al. .................... 455/424 |
| 2008/0095141 | A1 | * | 4/2008 | Kong et al. .................... 370/345 |
| 2011/0076975 | A1 | * | 3/2011 | Kim et al. ................. 455/226.1 |

\* cited by examiner

*Primary Examiner* — Daniel Washburn
*Assistant Examiner* — Sarah Hassan
(74) *Attorney, Agent, or Firm* — McDermott Will & Emery LLP

(57) ABSTRACT

Various embodiments are disclosed for providing timing tracking loops in a communication system. A communication system includes a delay locked loop (DLL) comprising a maximum region detector configured to identify a target channel profile comprising at least a portion of the multipath signals based on the timing information, the maximum region detector further configured to apply a weight vector to each channel tap in the target channel profile and determine a tap with a maximum power level relative to remaining channel taps in the channel profile. The system further comprises a window timing loop (WTL) adjuster configured to track a position of a channel estimation window (CEW) within an observation window corresponding to the maximum channel energy level, where the maximum channel energy level corresponds to the sum of the energy of all the taps for a given window.

23 Claims, 10 Drawing Sheets

SYSTEMS AND METHODS FOR PROVIDING TIMING TRACKING LOOPS IN A COMMUNICATION SYSTEM

CROSS REFERENCE TO RELATED APPLICATIONS

This application claims priority to, and the benefit of, U.S. Provisional Patent Application entitled "Cellular Baseband Processing" having Ser. No. 61/618,049, filed Mar. 30, 2012, the entirety of which is hereby incorporated by reference.

BACKGROUND

Lock target selectors are commonly used in communication systems to select the target that a delay lock loop (DLL) will be tracking. Under general channel conditions, most DLL designs attempt to lock to the channel tap with maximum power. For such cases, the combination of a DLL and a maximum tap power detector forms an integral component in sample timing tracking systems. Furthermore, communication systems typically generate an estimate for each received individual distinct path signal in a multipath channel environment. The generated estimate is generally referred to as a "channel estimate," and a channel estimate that is generated based on an individual distinct path signal may be referred to as a "path estimate."

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

In a communication system, signals received via an antenna are sampled by one sampling unit based on input from a tracking component, such as a delay lock loop (DLL). The combination of a DLL and a maximum tap power detector forms an integral component in sample timing tracking systems. Typically, a maximum tap power detector determines taps having the most power, and the delay lock loop DLL then locks to these taps.

However, various issues may arise with conventional DLL that incorporate maximum tap power detectors. For example, as the tap energy various over time due to fading associated with multipath propagation, the maximum energy tap also varies. This variation in the tracking target of the DLL results in noise being induced into the tracking system. Estimation error of the channel power profile also adds undesirable noise to the tracking system. Such noise in the DLL tracking loop causes a shift in the channel estimation window (CEW) such that the CEW drifts back and forth in a random fashion. Without proper tracking, the CEW eventually drifts to the point of communication link failure.

Figure 1:
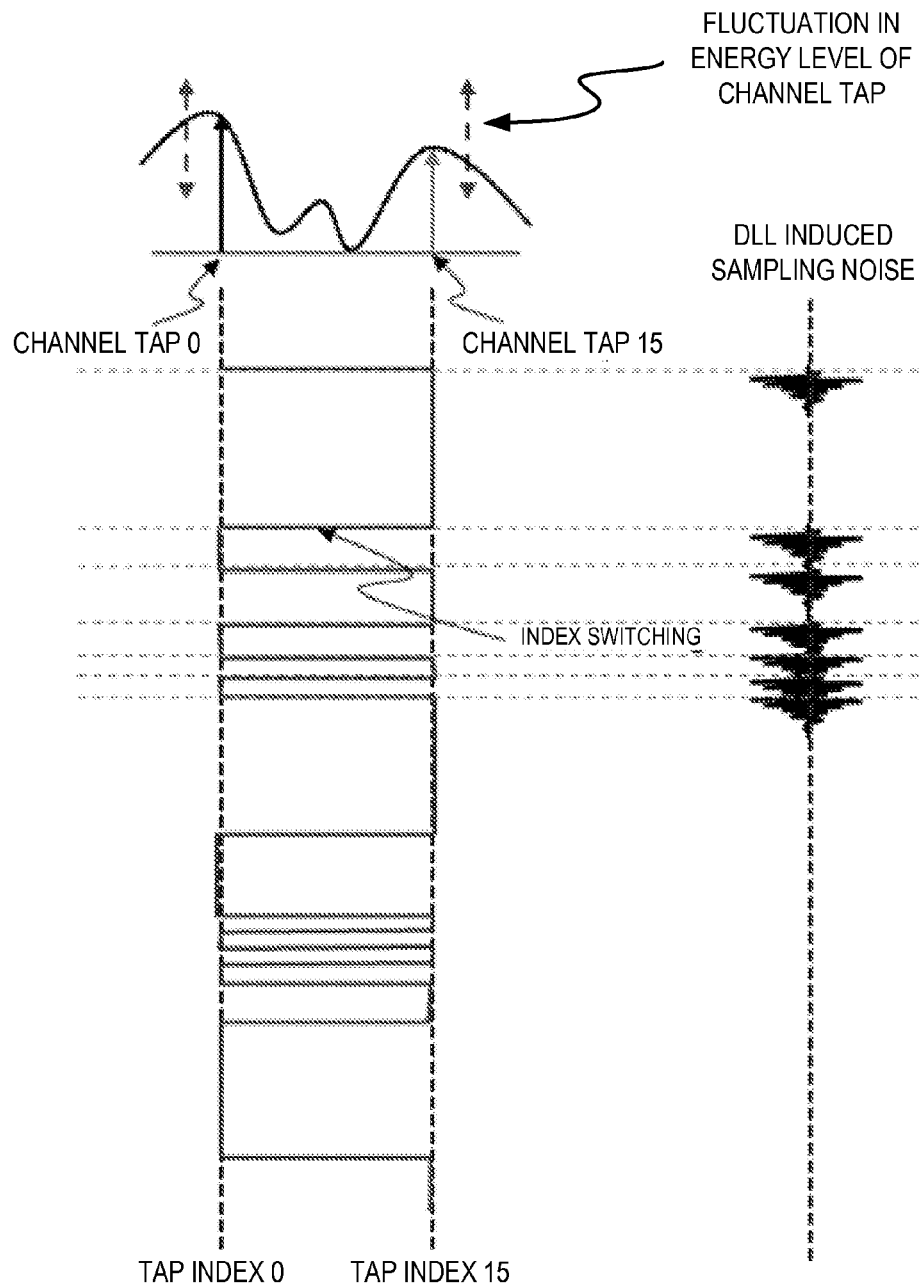
FIG. 1 illustrates the failure of a communication link as a result of noise being induced in the tracking loop of a communication system.
Figure 2:
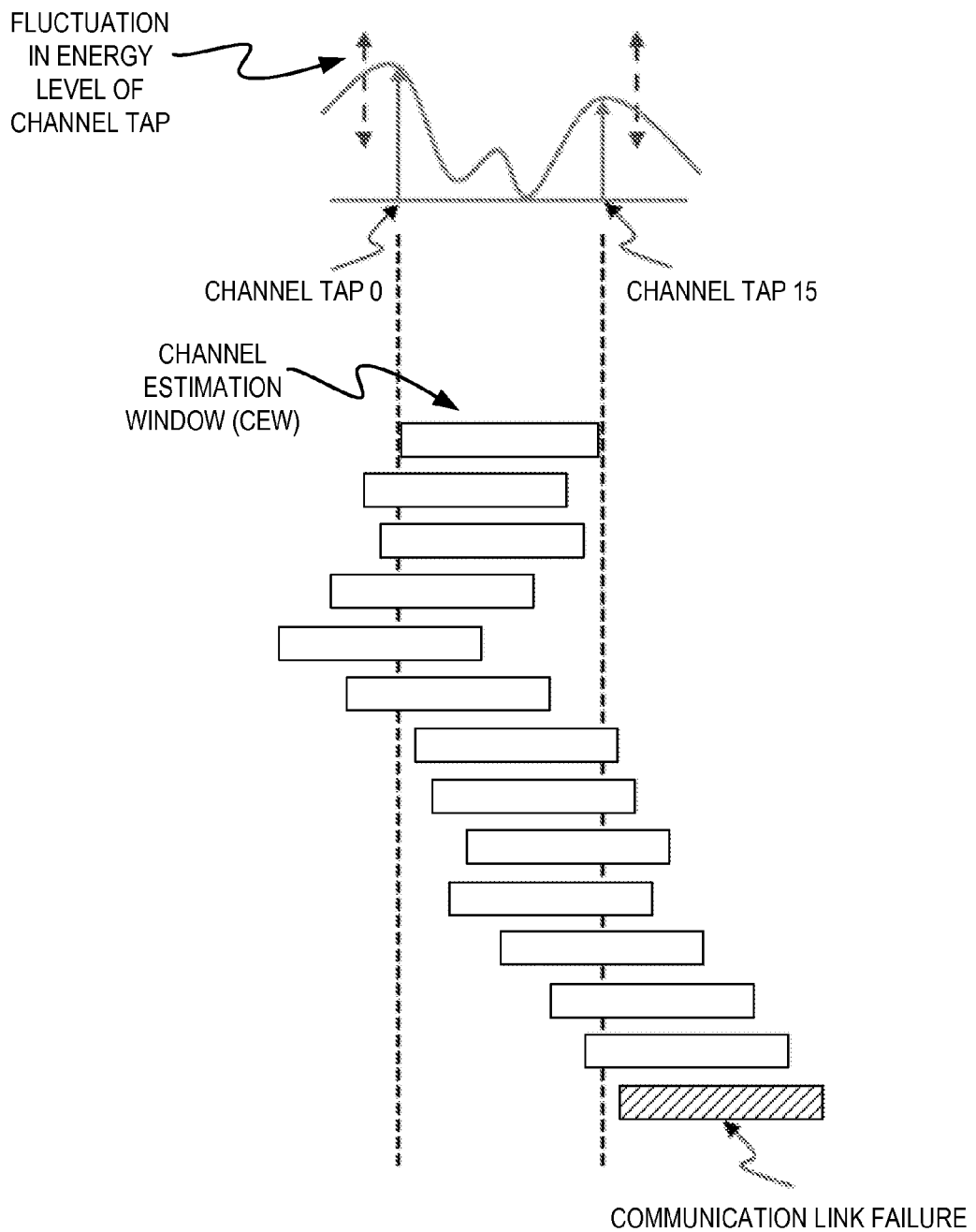
FIG. 2 illustrates drifting by a channel estimation window (CEW) due to fluctuations in channel tap energy.

Reference is made to FIG. 1, which further illustrates issues experienced by conventional communication systems that employ lock target selectors. As shown, when the channel tap energy varies over time due to fading, the channel tap associated with the maximum energy switches due, for example, to movement of the receiver. This high-frequency switching of the tracking target of the DLL results in noise being induced into the tracking system. In the illustration shown, switching occurs between channel tap 0 and channel tap 15, resulting in sampling noise being induced. Furthermore, estimation error associated with the channel power profile results in noise being induced in the tracking system. With reference to FIG. 2, the induced noise in the DLL tracking system causes the channel estimation window (CEW) to move back and forth in a random fashion where the CEW exhibits one-dimensional Brownian motion. Without proper tracking, the CEW eventually drifts to the point where the communication link between the transmitter and the receiver fails.

Various embodiments are disclosed for implementing a maximum region detector with a DLL, where the maximum region detector analyzes an entire channel profile as opposed to individual taps. Over-sampling is performed to preserve accuracy of the channel profile and low frequency information of the channel profile is extracted to reduce unnecessary switching. In the following discussion, a general description of a system and its components for performing data throttling is provided, followed by a discussion of the operation of the same.

Figure 3:
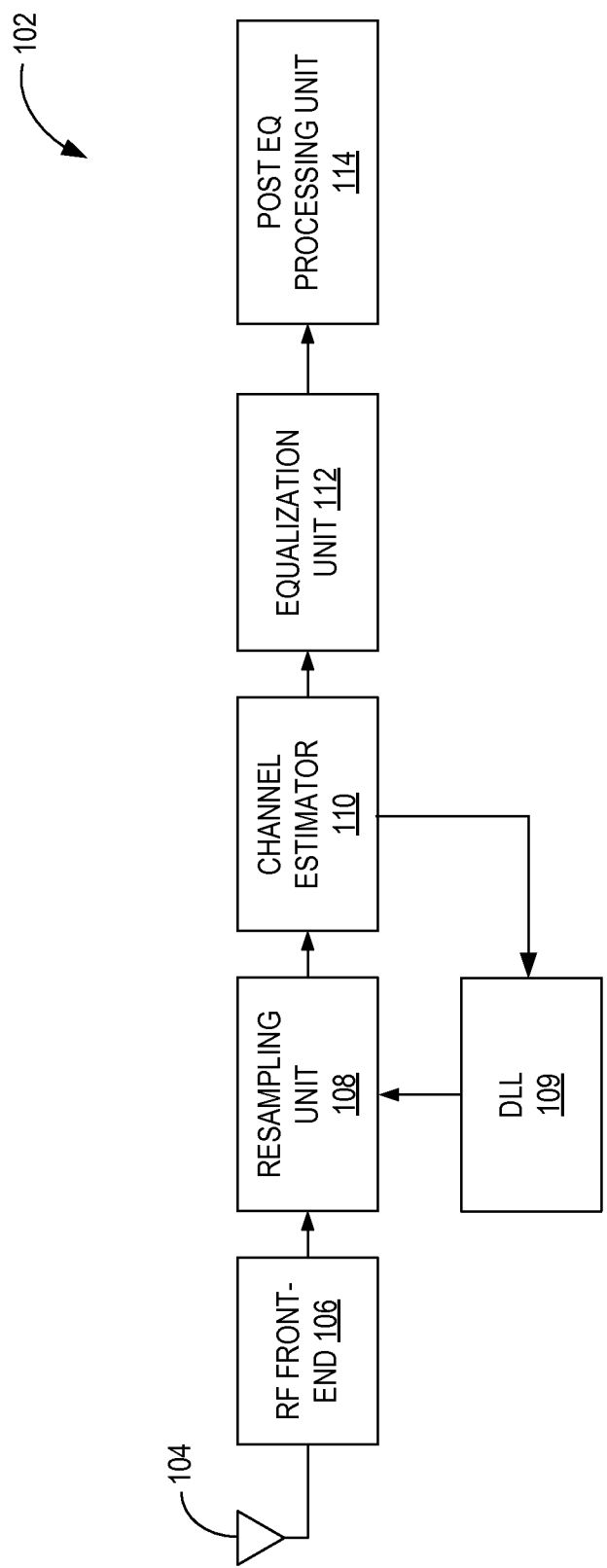
FIG. 3 is a block diagram of a communication system in which embodiments of a delay locked loop (DLL) with a maximum regional power detector for facilitating target selection may be implemented in accordance with various embodiments of the present disclosure.

FIG. 3 is a block diagram of a system for reducing target switching through the extraction of channel profile information for identifying the maximum regional power associated with a channel tap in accordance with various embodiments. Multi-path components of a transmitted radio frequency (RF) signal arrive in a time skewed manner at the RF receiver. The number of received multi-path components and the signal strength and signal to interference ratio of each multi-path component varies over time. Shown in FIG. 3 is a communication device 102 in which embodiments of a maximum region detector may be implemented in conjunction with a DLL. The communication device 102 includes an antenna 104, a radio frequency (RF) front-end unit 106, a resampling unit 108, a channel estimator 110, an equalization (EQ) unit 112, and a post-EQ processing unit 114. Each of these components may be implemented in hardware, software, or a combination of both.

The RF front-end unit 106 generally includes circuitry for receiving data via the antenna 104. The RF front-end performs such operations as filtering, strengthening of signals, and conversion of signals where conversion may include such operations as analog-to-digital conversion, down-conversion, and so forth. Information is modulated in the received signal, and the same information in a given transmission may be communicated over different channels due to different paths by each respective signal.

The output of the RF front-end unit 106 is forwarded to the resampling unit 108, which may comprise a sampling unit, registers, an accumulator (e.g., logic, such as an adder, and memory). The communication device 102 further includes a DLL 109 coupled to the resampling unit 108. In accordance with some embodiments, the resampling unit 108 receives processed digital samples from the RF front-end unit 106 and tracks the sampling by adjusting the sampling rate while feeding the sampling points to the accumulator to ensure synchronization in sampling by the resampling unit 108.

The channel estimator 110 determines channel conditions based on channel information received or determined based on certain channel parameters (e.g., bit error rate, signal-to-noise ratio, interference, etc.). The output of the channel estimator 110 is provided to an equalization unit 112 for providing known equalization functionality (e.g., decision feedback equalization, etc.). The output of the equalization unit 112 is fed to the post-EQ processing unit 114 for further processing.

Figure 4:
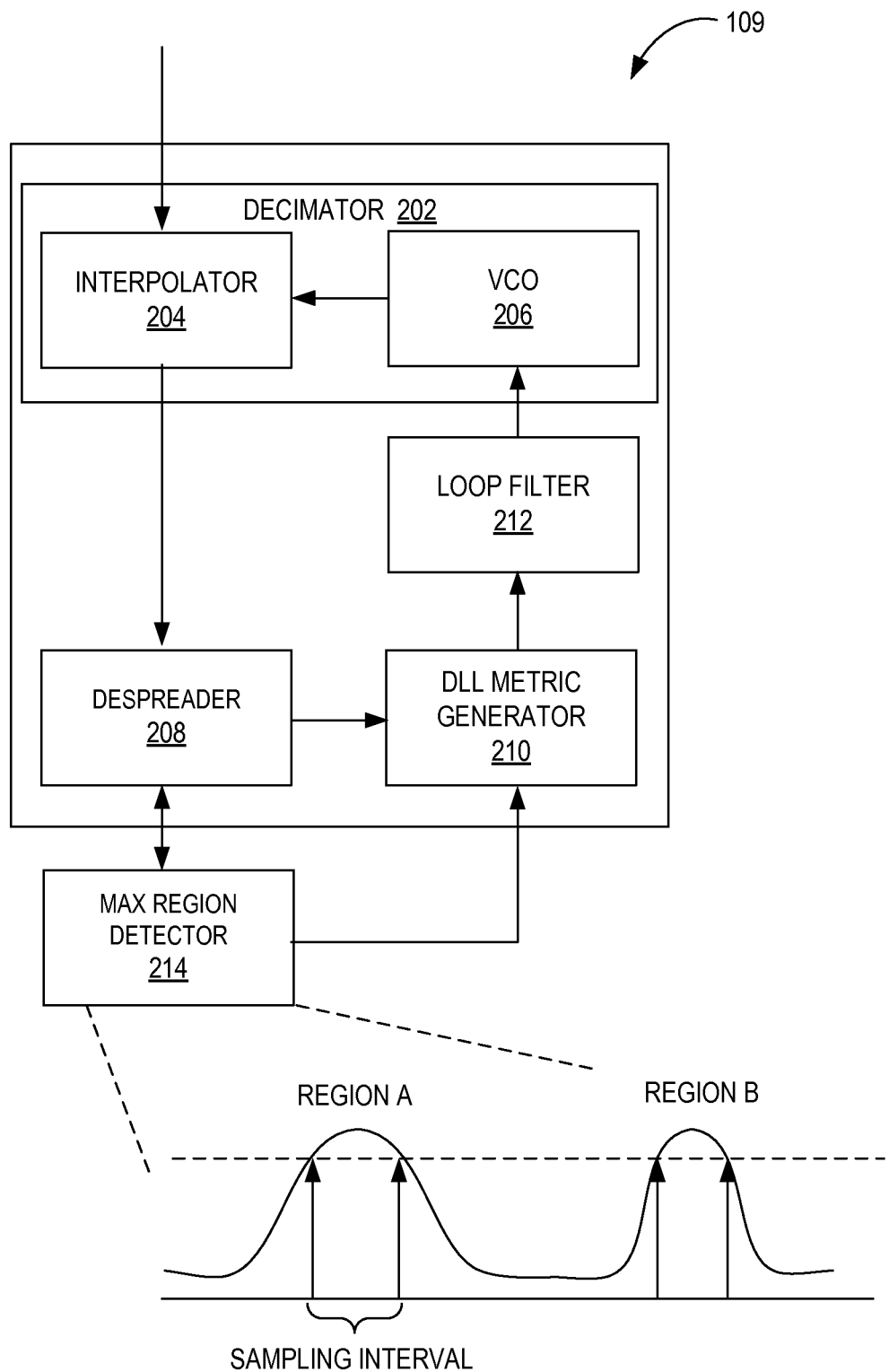
FIG. 4 is a schematic block diagram of the DLL of FIG. 3 implemented with a maximum region detector in accordance with various embodiments of the present disclosure.

Shown in FIG. 4 is a schematic block diagram of the delay lock loop (DLL) 109 of FIG. 3 implemented with a maximum region detector 214 in accordance with various embodiments. The DLL 109 includes a decimator 202 that comprises suitable logic, circuitry, and/or code configured to decimate the sampled data from the resampling unit 108 (FIG. 3). The decimator 202 may include an interpolator 204 and a voltage controlled oscillator (VCO) 206. The despreader 208 in the DLL 109 is configured to despread the baseband receive signal samples to produce channel symbols, which include pilot channel symbols and physical channel symbols. The despreader 208 outputs the channel symbols and/or the chip duration channel symbols to both the maximum region detector 214 and the DLL metric generator 210.

At the transmitter side within a Wideband Code Division Multiple Access (WCDMA) system, channel symbols are spread using a channel spreading code and then scrambled using a scrambling code. Multiple channels that have been spread may be combined and jointly scrambled prior to the transmission. The function of the despreader 208 is to produce channel symbols of multiple channels from the baseband receive signal samples by descrambling and then despreading the baseband receive signal samples using respective channel spreading sequences and one or more scrambling codes. In performing the descrambling and despreading operations, each chip of the receive signal samples is descrambled and despread and the descrambled/despread chips are accumulated over the spreading interval.

The despreader 208 performs early, on-time, and late pilot channel dispreading operations. The despreader 208 is further configured to scan a timing window (e.g., a 16-chip window) to derive a channel profile used by the maximum region detector 214 for identifying a maximum region within the timing window.

In accordance with various embodiments, the loop filter 212 in the DLL 109 comprises a second order loop, and the VCO 206 provides the timing for sampling operations by the interpolator 204 in the DLL 109. As described earlier, maximum tap detectors in conventional tracking systems typically identify taps having the most power as the tracking target. The DLL then locks to the identified tap. In particular, the tracking target (L) in conventional systems typically identifies the tap with the highest power, as follows:

$$L = \underset{k=0:N-1}{\mathrm{argmax}}\{c(k)\}$$

In the expression above, L represents the tracking target for the DLL within a conventional tracking system, while the function c( ) corresponds to the channel profile. The function c(k) corresponds to the $k^{th}$ tap of the channel profile, where the channel profile spans from 0 to (N−1) chips within a WCDMA system.

As discussed above, various issues arise with such conventional DLL/maximum tap power detector systems. For example, as the tap energy various over time due to fading associated with multipath propagation or other factors, the maximum energy tap also varies. This variation in the tracking target of the DLL results in noise being added to the tracking system. Estimation error of the channel power profile will also add undesirable noise to the tracking system. Such noise in the DLL tracking loop will cause a shift in the channel estimation window (CEW) back and forth in a random fashion. Without proper tracking, the CEW eventually drifts from the desired position, and the communication link will ultimately fail.

In accordance with various embodiments, the maximum region detector 214 implemented in conjunction with the DLL 109 is configured to performing over-sampling across a channel profile domain rather than a single channel tap within the channel profile in order to preserve the accuracy of channel profile measurements.

For example, for a timing window spanning 16 chips, over-sampling may be performed every 0.5 chips. Furthermore, the maximum region detector 214 is configured to extract the low frequency components of the channel profile in order to reduce unnecessary switching of the tracking target. In accordance with various embodiments, the tracking target for the DLL 109 may be selected according to the following expression:

$$L = \underset{k=0:N-1}{\mathrm{argmax}}\left\{\sum_{j=-M}^{M} c(k + \Delta \times j)w(k + \Delta \times j)\right\}$$

The function c(k) represents the $k^{th}$ tap within the channel power, while Δ represents the reciprocal of the sampling ratio $$\left(\text{i.e., } \Delta = \frac{1}{\text{over\_sampling\_ratio}}\right).$$

The parameter w(k) is a weight vector and corresponds to finite impulse response (FIR) filtering performed by the maximum region detector 214, where w represents the tap coefficient of the FIR filter.

The output of the FIR filter is a weighted sum of the current and a finite number of previous values of the input. The index j spans from M to −M, where M represents indexing of the FIR filter where 2M+1 is the length of the FIR filter (e.g., a 3-tap FIR filter). As reflected in the expression above, the tap with the maximum power is selected upon performing a summation operation across all the taps in the channel so that an accurate assessment of the maximum power tap is determined based on the channel profile.

Consider, for example, a 16-chip timing window where the over-sampling ratio is set to a value of 2. The power level is sampled at each interval (e.g., 0.5 tap) and passed through a 3-tap FIR filter with equal coefficients. Upon sampling the entire channel profile, the channel tap associated with the maximum channel energy is selected as the tracking target for the DLL 109. In this regard, the channel profile is filtered before selection of the maximum channel tap. Notably, the over-sampling and filtering operations performed by the maximum region detector provide a more accurate assessment of which tap to select for tracking purposes. The filtering removes noise (high frequency components), while over-sampling eliminates spectral aliasing experienced when operating at under sampling ratios. Upon selection of the maximum tap, the maximum region detector 214 forwards the index of the selected tracking target (e.g., tap 3) to the DLL metric generator 210.

Figure 5:
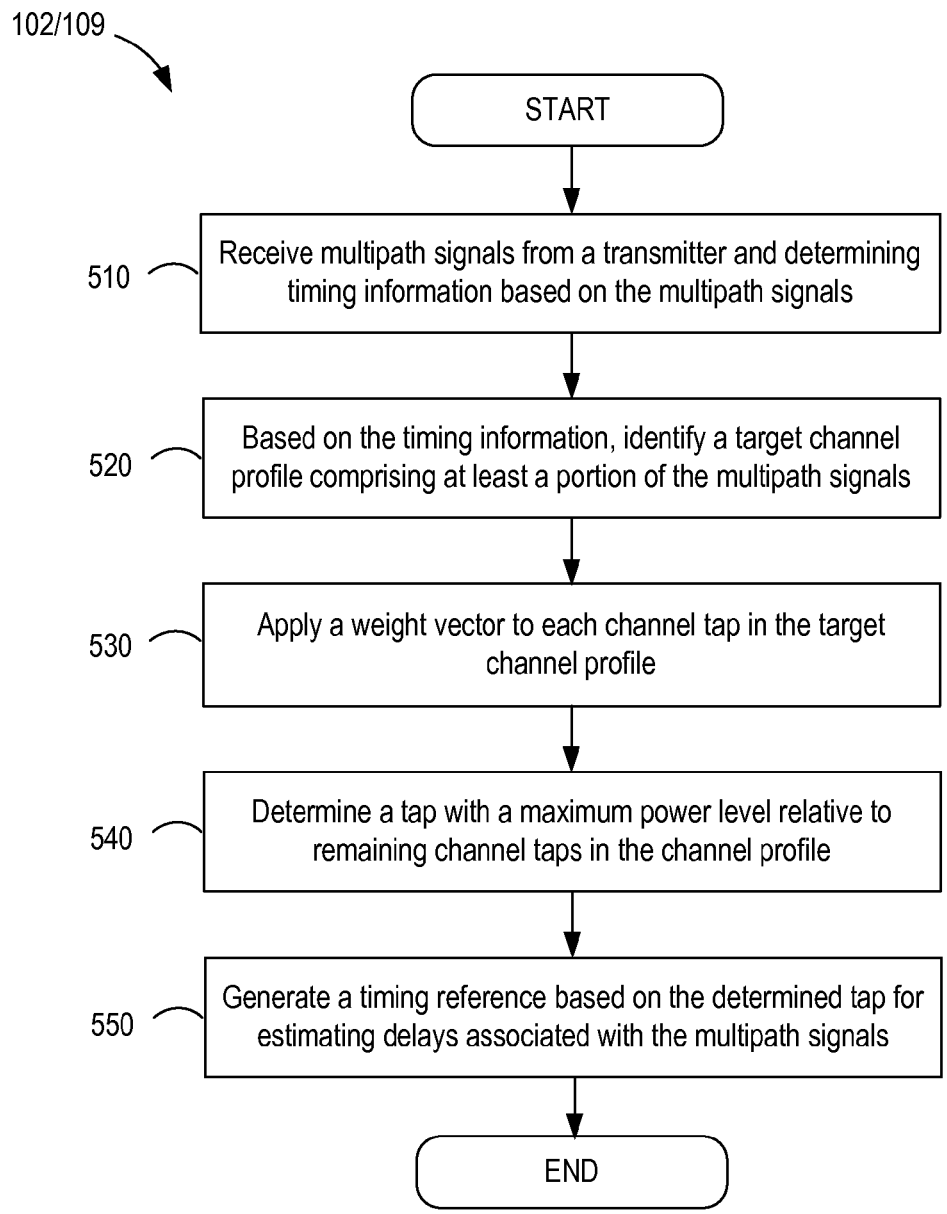
FIG. 5 is a flowchart illustrating examples of maximum tap region selection performed by various components of the communication device in FIG. 3 according to various embodiments of the present disclosure.

FIG. 5 is a flowchart illustrating examples of maximum tap region selection performed by various components of the communication device 102 (FIG. 1) according to various embodiments of the present disclosure. It is understood that the flowchart of FIG. 5 provides merely an example of the many different types of functional arrangements that may be employed. As an alternative, the flowchart of FIG. 5 may be viewed as depicting an example of steps of a method implemented in the communication device 102 according to one or more embodiments.

With reference to block 510 in FIG. 5, the radio frequency (RF) front-end 106 (FIG. 3) of the communication device 102 receives multipath signals from a transmitter and determines timing information based on the multipath signals. In block 520, the maximum region detector 214 (FIG. 4) identifies a target channel profile comprising at least a portion of the multipath signals based on the timing information.

In block 530, the maximum region detector 214 applies a weight vector to each channel tap in the target channel profile. In accordance with various embodiments, the application of a weight vector comprises sampling power levels across the channel profile according to a predetermined sampling ratio. In particular, over-sampling is performed by the maximum region detector 214 in order to eliminate spectral aliasing and in order to maintain accuracy of measurements across the channel profile. The application of a weight vector further comprises filtering of high-frequency components from the samples, thereby allowing the extraction of low frequency components of the channel profile.

By filtering such higher frequency components as noise, the maximum region detector 214 reduces switching of the tracking target. Note that this switch-protection mechanism also slows down the drifting of the channel estimation window (CEW), which is significant when the communication device 102 (FIG. 2) operates over channel conditions similar to a PB3 (Pedestrian B 3 km/hr) channel.

In block 540, the maximum region detector 214 determines a tap with a maximum power level relative to remaining channel taps in the channel profile. Referring back briefly to FIG. 4, the tap selected by the maximum region detector 214 is then forwarded to the DLL metric generator 210 (FIG. 2) in the DLL 109 (FIG. 2). Referring back to FIG. 5, in block 550, the DLL 109 generates a timing reference based on the determined tap for estimating delays associated with the multipath signals.

While embodiments of the maximum region detector 214 described herein may reduce the drifting of the CEW by reducing the noise introduced into the DLL 109 tracking loop, drifting of the CEW can remain an issue, particularly in the presence of multiple dominant paths. In general, communication systems rely on the timing reference provided by the DLL 109 for synchronization of the CEW because for a multipath channel with a single dominant path, the desired CEW and DLL tracking are highly correlated. However, when a multipath channel has multiple dominant paths, the tracking by the DLL 109 becomes independent of the adjustment needed for the CEW. As a result, the CEW may continue to drift in a random fashion that models one-dimensional Brownian motion. With reference back to FIG. 2, the CEW may eventually drift to the extent that the communication link with the transmitter fails.

Figure 6:
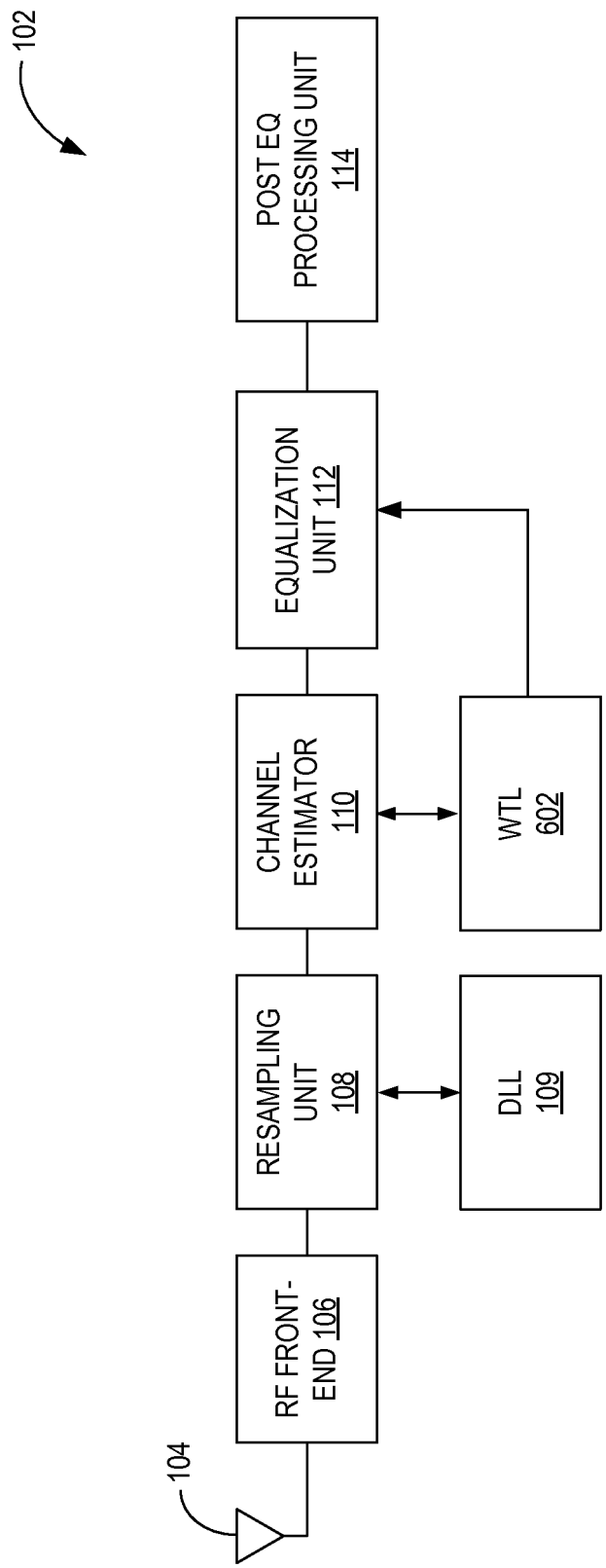
FIG. 6 shows an alternative embodiment of the communication device in FIG. 3, wherein a window timing loop (WTL) adjuster is coupled to the channel estimator for providing a closed loop timing structure used in tracking the CEW according to various embodiments of the present disclosure.

In accordance with various embodiments, a window timing loop (WTL) adjuster is implemented in the communication device 102 for channel estimation. Reference is made to FIG. 6, which shows an alternative embodiment of the communication device 102 in FIG. 3, where a WTL adjuster 602 is coupled to the channel estimator 110 for providing a closed loop structure used in tracking the CEW. In accordance with various embodiments, the WTL adjuster 602 operates independently of the DLL 109 tracking loop, thereby allowing the CEW to be accurately positioned regardless of the channel conditions.

Figure 7:
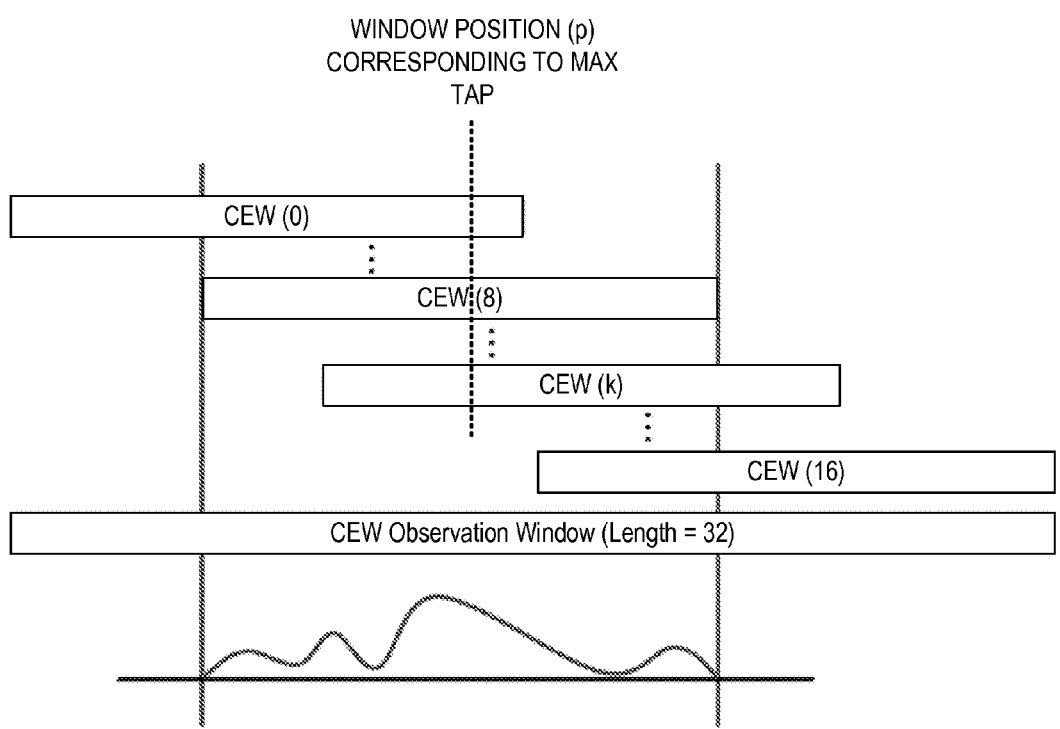
FIG. 7 illustrates positioning of the CEW within a given CEW observation window.

To further illustrate, reference is made to FIG. 7. Assume that a CEW has an observation interval of length 2W (e.g., length 32 for the illustration shown). In operation, the WTL adjuster 602 adjusts the positioning of the CEW in increments of W. In particular, the WTL adjuster 602 adjusts the CEW to a window position (p) such that the CEW corresponds to the largest overall channel energy level. The overall channel energy level corresponds to the sum of the energy of all the taps for a given window. The position of the CEW is adjusted using a closed loop operation so that the desired CEW stays locked to the center of the observation interval of length 2W. In the non-limiting example of FIG. 7, the CEW has a length of 16 and the observation window length is 32, thereby yielding a total of 17 possible CEW positions within the CEW observation window in which the largest overall channel energy level is located.

In accordance with various embodiments, the index of the CEW containing the maximum channel energy (i.e., the sum of the energy for all the taps in the current window) may be determined according to the following expression:

$$\text{Max\_Pwr\_CEW\_index} = \underset{k=0:16}{\arg\max} \left\{ \sum_{j=0}^{15} |c(k+j)|^2 \right\}$$

With further reference to the illustration of FIG. 7, the value of k spans from 0 to 16. The function c(k) represents the channel estimation of the $k^{th}$ channel tap based on a resolution level of C×1. The value of k ranges from 0 to 16 based on a CEW window length of 16 and an observation window length of 32 and corresponds to the channel tap index. The parameter j corresponds to the window size of the CEW. The position of the CEW is adjusted according to an incremental value by the WTL adjuster 602, where incremental value is calculated as follows:

$$\text{CEW\_ADJ} = \begin{cases} +1 & \text{if Max\_Pwr\_CEW\_index} > 8 \\ -1 & \text{if Max\_Pwr\_CEW\_index} < 8 \\ 0 & \text{if Max\_Pwr\_CEW\_index} = 8 \end{cases}$$

Note that the values of the incremental value and CEW observation window size are not limited to the values provided and that other values may be implemented based on design considerations. In accordance with various embodiments, the WTL adjuster 602 further comprises a CEW selector, which allows the WTL adjuster 602 to make larger adjustments for tracking the target CEW, where the channel estimation location by the CEW selector is calculated according to the following expression:

$$\hat{c}(j)=c(j+\text{Max\_Pwr\_CEW\_index}) \forall j \in \{0,1,\ldots,15\}.$$

Note that for the implementation described above, the switch protection threshold for the maximum region power detector becomes robust against different channel conditions, and the maximum region power detector 214 no longer needs to adapt to the Doppler frequency.

Figure 8:
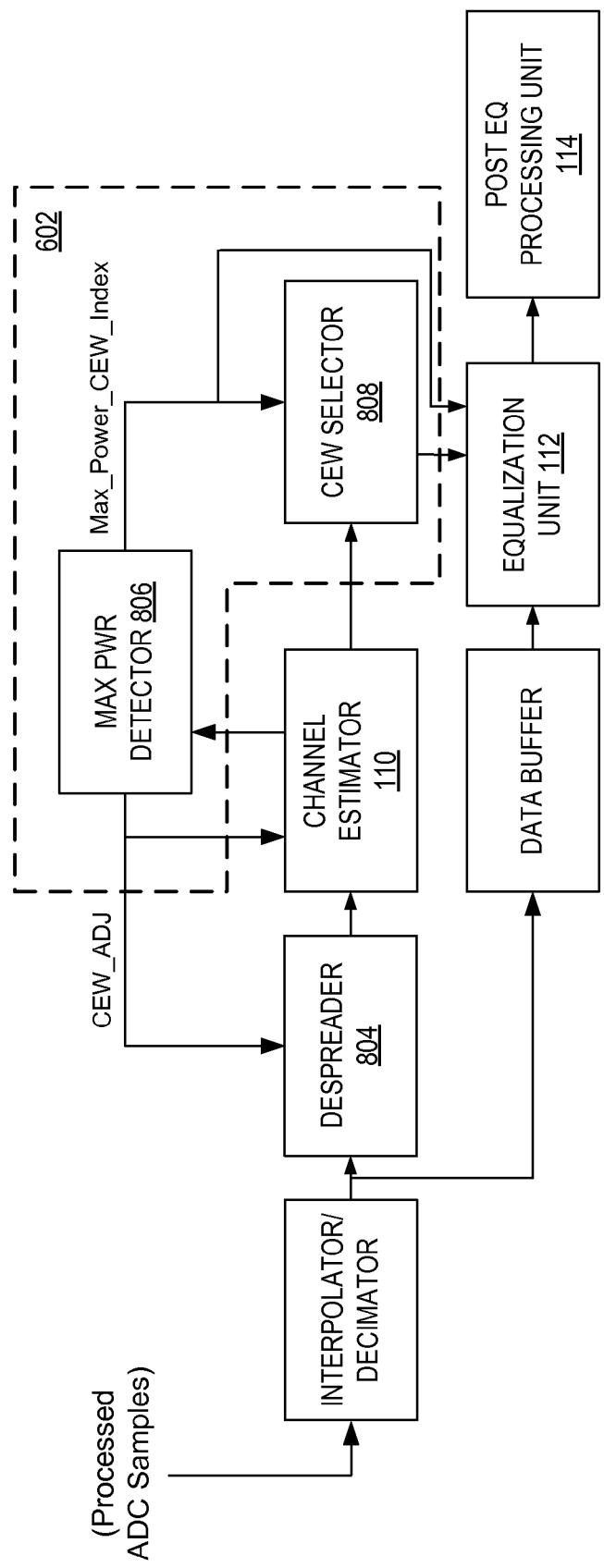
FIG. 8 is a schematic diagram of an embodiment of the WTL adjuster in the communication device of FIG. 6 according to various embodiments of the present disclosure.

Reference is made to FIG. 8, which is a schematic diagram of an embodiment of the WTL adjuster 602 in the communication device 102 of FIG. 6. The channel estimator 110 is configured to generate channel estimates based on despread samples. At the transmitter of a WCDMA system, channel symbols are spread using a channel spreading code and then scrambled using a scrambling code. Multiple channels that have been spread may be combined and jointly scrambled prior to transmission.

The despreader 804 in the communication device 102 (FIG. 6) is configured to produce channel symbols of multiple channels from the baseband receive signal samples by descrambling and then despreading the baseband receive signal samples using respective channel spreading sequences and one or more scrambling codes. In performing the descrambling and despreading operations each chip of the receive signal samples is descrambled and despread and the descrambled/despread chips are accumulated over the spreading interval.

The WTL adjuster 602 is coupled to the channel estimator 110 and forms a closed loop configuration. The WTL adjuster 602 comprises a maximum power detector 806 configured to analyze the channel profile and scan for the CEW index corresponding to the largest overall channel energy level. As shown, the maximum power detector 806 outputs the max_power_CEW_index and CEW adjustment amount (CEW_Adj), which are calculated according to the expressions above.

Based on the CEW adjustment amount, the CEW selector 808 is configured to select the CEW corresponding to the largest overall channel energy level. The CEW selection is forwarded to the equalization unit 112, which calculates the number of coefficients corresponding to the taps of the equalization unit 112 needed to overcome the effects that the communication channel has on the received data.

Figure 9:
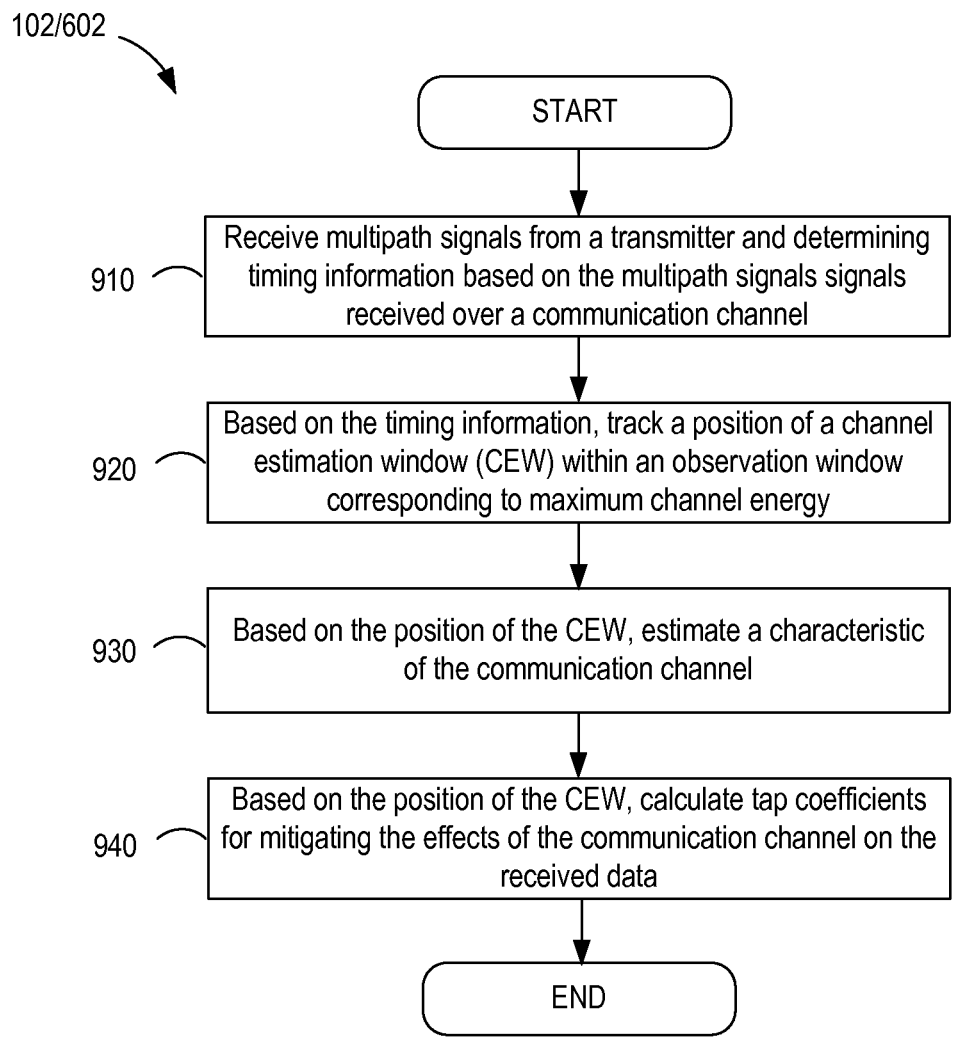
FIG. 9 is a flowchart illustrating examples of window loop timing performed by various components of the communication device in FIG. 6 according to various embodiments of the present disclosure

FIG. 9 is a flowchart illustrating examples of window loop timing performed by various components of the communication device 102 (FIG. 6) according to various embodiments of the present disclosure. It is understood that the flowchart of FIG. 9 provides merely an example of the many different types of functional arrangements that may be employed. As an alternative, the flowchart of FIG. 9 may be viewed as depicting an example of steps of a method implemented in the communication device 102 according to one or more embodiments.

With reference to block 910 in FIG. 9, the radio frequency (RF) front-end 106 (FIG. 6) of the communication device 102 receives multipath signals from a transmitter and determines timing information based on the multipath signals received over a communication channel. In block 920, the WTL adjuster 602 (FIG. 8) tracks a position of a channel estimation window (CEW) within an observation window corresponding to maximum channel energy based on the timing information, where the maximum channel energy level corresponds to the sum of the energy of all the taps for a given window. In accordance with various embodiments, the WTL adjuster 602 operates independently of the DLL 109 (FIG. 6) and adjusts the positioning of the CEW independent of the channel conditions. In operation, the WTL adjuster 602 determines the position of the CEW that corresponds to the maximum channel energy relative to the other possible positions in a given CEW observation window.

In block 930, the channel estimator 110 (FIG. 8) estimates a characteristic of the communication channel based on the position of the CEW that corresponds to the maximum channel energy. Specifically, the channel estimator 110 may be configured to generate an estimate for each received individual distinct path signal in the multipath channel based on the position of the CEW.

In block 940, the equalization unit 112 calculates tap coefficients for mitigating the effects of the communication channel on the received data based on the position of the CEW.

Figure 10:
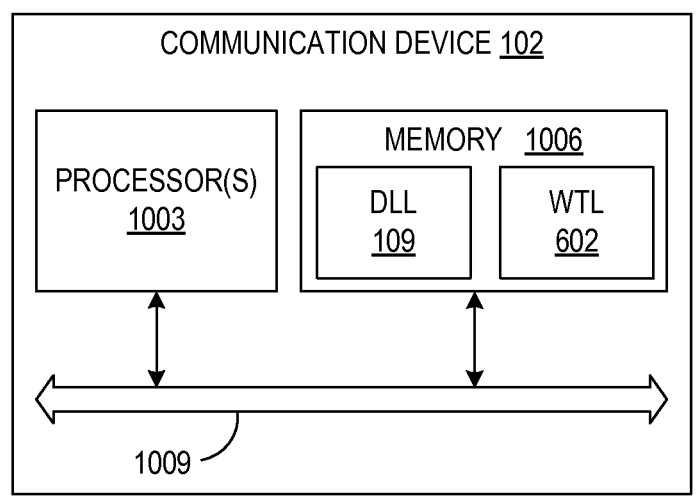
FIG. 10 is a schematic block diagram of the communication device of FIG. 3 and FIG. 6 according to various embodiments of the present disclosure.

FIG. 10 is a schematic block diagram of the communication device 102 of FIG. 3 and FIG. 6 according to various embodiments of the present disclosure. The communication device 102 includes a processor 1003 and a memory 1006, which are coupled to a local interface 1009. The communication device 102 may comprise, for example, at least one computing device or like device. The communication device 102 may be embedded on a chip as part of an on-chip network, such as one embedded in a system on a chip (SoC) for a communication system. The local interface 1009 may comprise, for example, a data bus with an accompanying address/control bus or other bus structure as can be appreciated.

The communication device 102 may be implemented as a board level product, as a single chip, application specific integrated circuit (ASIC), and so on. Alternatively, certain aspects of the present invention are implemented as firmware. Such components as the delay locked loop (DLL) 109 and the window timing loop component 602 may be stored in memory 1006 with other components and executed by the processor 1003. It is understood that there may be other systems that are stored in the memory 1006 and are executable by the processor 1003 as can be appreciated. A number of software components are stored in the memory 1006 and are executable by the processor 1003. In this respect, the term "executable" means a program file that is in a form that can ultimately be run by the processor 1003.

Examples of executable programs may be, for example, a compiled program that can be translated into machine code in a format that can be loaded into a random access portion of the memory 1006 and run by the processor 1003, source code that may be expressed in proper format such as object code that is capable of being loaded into a random access portion of the memory 1006 and executed by the processor 1003, or source code that may be interpreted by another executable program to generate instructions in a random access portion of the memory 1006 to be executed by the processor 1003, etc.

The memory 1006 is defined herein as including both volatile and nonvolatile memory and data storage components. Volatile components are those that do not retain data values upon loss of power. Nonvolatile components are those that retain data upon a loss of power. Thus, the memory 1006 may comprise, for example, random access memory (RAM), read-only memory (ROM), and/or other memory components, or a combination of any two or more of these memory components. In addition, the RAM may comprise, for example, static random access memory (SRAM), dynamic random access memory (DRAM), or magnetic random access memory (MRAM) and other such devices.

Also, the processor 1003 may represent multiple processors 1003 and the memory 1006 may represent multiple memories 1006 that operate in parallel processing circuits, respectively. In such a case, the local interface 1009 may be an appropriate network that facilitates communication between any two of the multiple processors 1003, between any processor 1003 and any of the memories 1006, or between any two of the memories 1006, etc. The local interface 1009 may comprise additional systems designed to coordinate this communication, including, for example, performing load balancing. The processor 1003 may be of electrical or of some other available construction. In one embodiment, the processor 1003 and memory 1006 may correspond to a system-on-a-chip.

Although portions of the communication device 102 described herein may be embodied in software or code executed by general purpose hardware as discussed above, as an alternative, the same may also be embodied in dedicated hardware or a combination of software/general purpose hardware and dedicated hardware. If embodied in dedicated hardware, each component may be implemented as a circuit or state machine that employs any one of or a combination of a number of technologies. These technologies may include, but are not limited to, discrete logic circuits having logic gates for implementing various logic functions upon an application of one or more data signals, ASICs having appropriate logic gates, or other components, etc. Such technologies are generally well known by those skilled in the art and, consequently, are not described in detail herein.

The flowcharts of FIGS. 5 and 9 show the functionality and operation of an implementation of portions of the communication device 102 (FIG. 3 and FIG. 6). If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 1003 in a computer system or other system. The machine code may be converted from the source code, etc. If embodied in hardware, each block may represent a circuit or a number of interconnected circuits to implement the specified logical function(s).

Although the flowcharts of FIGS. 5 and 9 show a specific order of execution, it is understood that the order of execution may differ from that which is depicted. For example, the order of execution of two or more blocks may be scrambled relative to the order shown. Also, two or more blocks shown in succession in FIGS. 5 and 9 may be executed concurrently or with partial concurrence. Further, in some embodiments, one or more of the blocks shown in FIGS. 5 and 9 may be skipped or omitted. It is understood that all such variations are within the scope of the present disclosure.

Also, any logic or application described herein that comprises software or code can be embodied in any non-transitory computer-readable medium for use by or in connection with an instruction execution system such as, for example, a processor 1003 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can comprise any one of many physical media such as, for example, magnetic, optical, or semiconductor media. More specific examples of a suitable computer-readable medium would include, but are not limited to, random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

At least the following is claimed:

1. A method for performing channel tap estimation in a communication device, comprising:
   receiving multipath signals from a transmitter and determining timing information based on the multipath signals;
   based on the timing information, identifying a target channel profile comprising at least a portion of the multipath signals;
   applying a weight vector to each of a plurality of channel taps in the target channel profile;
   determining a regional power level of each respective channel tap of the plurality of channel taps, the regional power level of one of the plurality of channel taps being determined based at least on a sum of a power level of a channel tap located before the one of the plurality of channel taps in the target channel profile and a power level of a channel tap located after the one of the plurality of channel taps in the target channel profile;

determining one of the plurality of channel taps having a largest regional power level relative to the plurality of channel taps in the target channel profile; and generating a timing reference based on the determined one of the plurality of channel taps having the largest regional power level, the time reference for estimating delays associated with the multipath signals.

2. The method of claim 1, wherein applying the weight vector comprises:

obtaining samples according to a sampling ratio, wherein sampling is performed across an entirety of the target channel profile;

filtering high-frequency components from the samples; and upon filtering the samples, determining the tap with the maximum regional power level relative to remaining taps in the channel profile.

3. The method of claim 2, wherein filtering is performed utilizing a multitap finite impulse response (FIR) filter.

4. The method of claim 3, wherein filtering is performed utilizing a 3-tap FIR filter.

5. The method of claim 2, wherein the sampling ratio is equal to a value greater than one.

6. The method of claim 2, wherein obtaining samples is performed at a fractional chip spacing.

7. The method of claim 6, wherein the fractional chip spacing comprises ½ chip spacing.

8. The method of claim 1, wherein the multipath signals received from the transmitter comprise spread spectrum signals in a Wideband Code-Division Multiple Access (WCDMA) system.

9. The method of claim 1, further comprising forwarding the determined one of the plurality of channel taps with the largest regional power level to a delay locked loop (DLL) within the communication device.

10. A method for processing data in a communication device, comprising:

receiving multipath signals from a transmitter and determining timing information based on the multipath signals received over a communication channel;

based on the timing information, tracking a position of a channel estimation window (CEW) within an observation window corresponding to a tap associated with a maximum overall channel energy level, wherein the maximum overall channel energy level comprises a sum of energies of taps within the channel estimation window at the position, including an energy of at least one tap before the tap associated with the maximum overall channel energy level;

based on the position of the CEW, estimating a characteristic of the communication channel; and based on the position of the CEW, calculating tap coefficients for mitigating effects of the communication channel on received data.

11. The method of claim 10, wherein estimating the characteristic of the communication channel is performed by a channel estimator, and wherein calculating tap coefficients is performed by an equalizer.

12. The method of claim 11, wherein tracking the position of the CEW is performed by a window timing loop (WTL) adjuster in a closed loop configuration formed by the WTL adjuster, the channel estimator, and the equalizer.

13. The method of claim 12, wherein tracking the position of the CEW further comprises:

adjusting the position of the CEW across the observation window; and sampling a channel energy corresponding to each adjusted position of the CEW.

14. The method of claim 13, wherein adjusting the position of the CEW is performed according to an incremental step, wherein the incremental step is a function of a first size of the observation window and a second size of the CEW.

15. The method of claim 14, wherein the first size of the observation window and the second size of the CEW are set according to an initial estimation of the characteristic of the communication channel.

16. A communication system, comprising:

a radio frequency (RF) front end configured to receive multipath signals from a transmitter via a communication channel and determining timing information based on the multipath signals;

a delay locked loop (DLL) comprising a maximum region detector configured to identify a target channel profile comprising at least a portion of the multipath signals based on the timing information, the maximum region detector further configured to apply a weight vector to each channel tap in the target channel profile and determine a tap with a maximum power level relative to remaining channel taps in the target channel profile;

a window timing loop (WTL) adjuster configured to track a position of a channel estimation window (CEW) within an observation window corresponding to a tap associated with a maximum channel energy, wherein the maximum channel energy corresponds to a sum of tap energies including a tap energy of at least one tap before the tap associated with the maximum channel energy;

a channel estimator coupled to the WTL adjuster configured to estimate a characteristic of the communication channel based on the position of the CEW; and an equalizer coupled to the WTL adjuster configured to calculate tap coefficients for mitigating effects of the communication channel on received data based on the position of the CEW.

17. The system of claim 16, wherein the maximum region detector in the DLL and the WTL adjuster are configured to operate independently.

18. The system of claim 16, wherein the WTL adjuster forms a closed loop configuration with the channel estimator and the equalizer.

19. The system of claim 16, wherein the WTL adjuster is configured to adjust the position of the CEW according to an incremental step that is a function of a first size of the observation window and a second size of the CEW.

20. The system of claim 16, wherein the maximum region detector is configured to apply the weight vector via a multi-tap finite impulse response (FIR) filter.

21. The method of claim 13, wherein the sampling is performed based at least on a sampling ratio that has a value greater than one.

22. The communication system of claim 16, wherein the maximum region detector is configured to obtain samples based at least on a sampling ratio, wherein sampling is performed across an entirety of the target channel profile, and to filter high-frequency components from the samples.

23. The communication system of claim 22, wherein the sampling ratio has a value greater than one.

* * * * *